United States Patent [19]

Pan

[11] Patent Number: 5,699,377

[45] Date of Patent: Dec. 16, 1997

[54] NARROW LINEWIDTH, STABILIZED SEMICONDUCTOR LASER SOURCE

[75] Inventor: Jing-Jong Pan, Milpitas, Calif.

[73] Assignee: E-Tek Dynamics, Inc., San Jose, Calif.

[21] Appl. No.: 640,417

[22] Filed: Apr. 30, 1996

[51] Int. Cl.$^6$ .................................. H01S 3/08; G02B 6/00
[52] U.S. Cl. .................... 372/92; 372/6; 372/18; 372/99; 372/102; 385/12; 385/37; 385/123
[58] Field of Search .................... 372/6, 18, 20, 372/43, 49, 92, 96, 99, 102, 107, 108; 385/12, 37, 123; 250/227.11, 227.23, 227.24

[56] References Cited

U.S. PATENT DOCUMENTS

| | | | |
|---|---|---|---|
| 4,558,449 | 12/1985 | Gordon | 372/44 |
| 4,593,969 | 6/1986 | Goodman et al. | 385/123 X |
| 4,852,960 | 8/1989 | Alferness et al. | 385/37 X |
| 5,007,705 | 4/1991 | Morey et al. | 385/12 X |
| 5,042,898 | 8/1991 | Morey et al. | 385/37 |
| 5,134,620 | 7/1992 | Huber | 372/6 |
| 5,305,335 | 4/1994 | Ball et al. | 372/6 |
| 5,317,576 | 5/1994 | Leonberger et al. | 372/6 |
| 5,319,435 | 6/1994 | Melle et al. | 250/227.18 |
| 5,367,589 | 11/1994 | MacDonald et al. | 385/37 |
| 5,485,481 | 1/1996 | Ventrudo et al. | 372/6 |
| 5,511,083 | 4/1996 | D'Amato et al. | 372/6 |

*Primary Examiner*—Brian Healy
*Attorney, Agent, or Firm*—Townsend and Townsend and Crew LLP

[57] ABSTRACT

A semiconductor laser source having a laser diode and a fiber Bragg grating is described. The laser diode has first and second facets from which output light is emitted. A first end of the fiber Bragg grating is located near the second facet to receive output light from the laser diode. The fiber Bragg grating has a very narrow linewidth about a selected wavelength and reflects output light in the selected narrow linewidth back into the laser diode through its second facet. The output light emitted from the first facet has a very narrow linewidth about the selected linewidth.

21 Claims, 3 Drawing Sheets

NARROW LINEWIDTH, STABILIZED SEMICONDUCTOR LASER SOURCE

BACKGROUND OF THE INVENTION

The present invention is related to the field of light sources for optical fiber networks, and more particularly, to semiconductor laser source package assemblies having stable outputs of very narrow linewidths.

In fiber optics, semiconductor lasers provide the only practical source of light signals for optical fiber networks. Sources with narrow linewidths are desirable in certain applications, especially WDM (Wavelength Division Multiplexing) networks. In a WDM network, the wavelength of optical signals is used to direct the signals from its source to the desired destination. Hence the more narrow the linewidths of the various sources in a network, the more communication channels can operate over the network. For example, recently the International Telecommunications Union (ITU) has proposed a Dense WDM network standard with channels having a separation of 100 GHz frequency (or 0.8 nm wavelength). Light sources with narrow linewidths are required for such systems.

Thus a narrow linewidth semiconductor laser source it is highly desirable. The source should be readily manufacturable to keep the costs of the fiber optical network low to permit the widespread adoption of the network. Furthermore, the source output should remain stable to lower the possibility of noise and crosstalk between channels.

The present invention presents solves or substantially mitigates these problems.

SUMMARY OF THE INVENTION

The present invention provides for a semiconductor laser source having a laser diode and a fiber Bragg grating. The laser diode has first and second facets from which output light is emitted. A first end of the fiber Bragg grating is located near the second facet to receive output light therefrom. The fiber Bragg grating has a very narrow linewidth about a selected wavelength to reflect output light in the selected narrow linewidth back into laser diode second facet so that the output light emitted from the first facet has a very narrow linewidth about the selected linewidth.

DETAILED DESCRIPTION OF SPECIFIC EMBODIMENTS

Semiconductor lasers are formed by laser diode chips. The laser diode operates by the stimulated emission of light between two opposing facets of the chip and the light output is emitted typically through both facets. For most applications, the output light from a laser diode has a fairly narrow range of wavelengths. The present invention narrows the linewidth of this light output even more so that laser light sources in the form of laser diode package assemblies.

Figure 1:
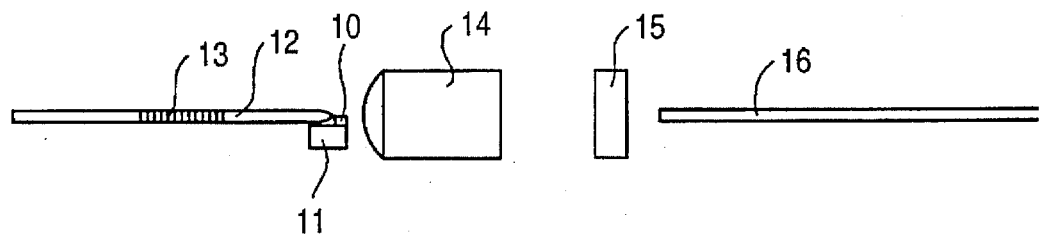
FIG. 1 illustrates a general arrangement of elements for a laser diode package assembly according to one embodiment of the present invention.

FIG. 1 shows a general arrangement of elements for a laser diode package assembly according to one embodiment of the present invention. A laser diode 10 is mounted to a base 11. Opposite one facet of the laser diode is a lens complex 14 which receives the light from the laser diode and refocuses the light emitted from the diode to the end, specifically the core, of an output optical fiber 16. An optical isolator subassembly 15, such as a birefringent polarizer/Faraday rotator/birefringent analyzer combination described in U.S. Pat. No. 5,208,876, is fixed between the lens complex 14 and the end of the fiber 15. The optical isolator subassembly 15 blocks light from the fiber 16 from entering the laser diode 10, which is highly sensitive to outside interference.

The second facet of the laser diode 10 is placed near one end of a fiber Bragg grating 12 to receive light output from the second facet. A fiber Bragg grating is an optical fiber in which the propagation constant (or the refractive index) of the core is periodically varied, as symbolically indicated by the vertical bars 13. A typical fiber Bragg grating has a very narrow reflection linewidth, or band. The fiber Bragg grating 12 is designed such that light signals of wavelengths in a narrow linewidth centered about a predetermined wavelength are reflected back toward the laser diode 10. This feedback narrows the output of the laser diode 10 so that its output light lies in a very narrow linewidth of wavelength. Light at wavelengths outside the narrow linewidth of the fiber Bragg grating 12 simply passes through the grating 12.

Figure 2A:
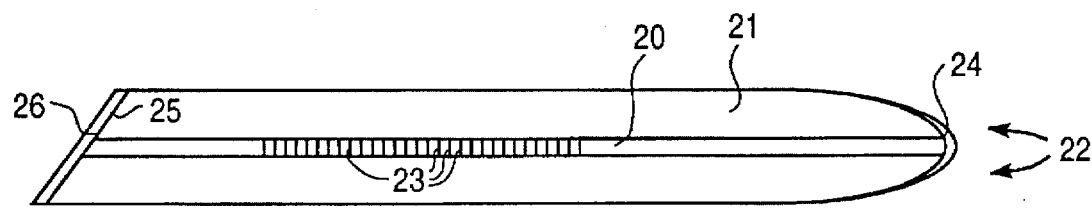
FIGS. 2A-2C illustrate various fiber Bragg gratings which may be used in the laser diode package assembly of FIG. 1.

FIG. 2A illustrates the details of one fiber Bragg grating 21 which may be used for the fiber grating 12 in the FIG. 1 assembly. Vertical bars 23 represent the periodic variation in the propagation constant (or refractive index) in the core 20 of the fiber Bragg grating 21. A microlens 22 is formed at one end of the grating 21. The microlens 22 directs light from laser diode into the core 20 of the grating 21.

The other end of grating 21 ends in a flat surface 25 at an angle to the plane perpendicular to the longitudinal axis of the fiber Bragg grating 21. The surface 25 is formed by slab polishing the end of the fiber at an angle 8°–11° from the perpendicular plane. Antireflection coatings 24 and 26 respectively cover the microlens 22 and the surface 25 at either ends of the grating 21. The antireflection coating 24 increases the light transmitted from the laser diode into the core 20. The coating 24 also helps in the transmission of the light reflected back into the laser diode from the grating 21. Likewise, the coating 26 helps in the transmission of unreflected light passing through the grating 21. The net result is that only light in a very narrow linewidth is reflected back by fiber Bragg grating into the laser diode.

Figure 2B:
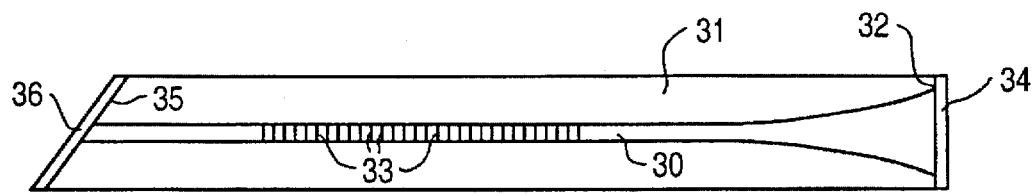

FIG. 2B details another fiber Bragg grating 31 which may be used in place of the fiber Bragg grating 21 in FIG. 2A. The core 30 in the grating 21 is expanded at the end which faces the laser diode. The shape of the expanded core is such that light at the flat end surface 32 is "funneled" into the core 30. The flat surface 32 is perpendicular to the longitudinal axis of the fiber of the grating 31 and is covered by an antireflection coating 34. Vertical bars 33 indicate the periodic variation in the propagation constant in the core 30. The opposite end of the grating 31 ends in angled flat surface 35, which is covered by an antireflection coating 36, as described previously with respect to the grating 21. Optical fibers with expanded cores may be obtained from Sumitomo Osaka Cement, Ltd. of Tokyo, Japan.

Figure 2C:
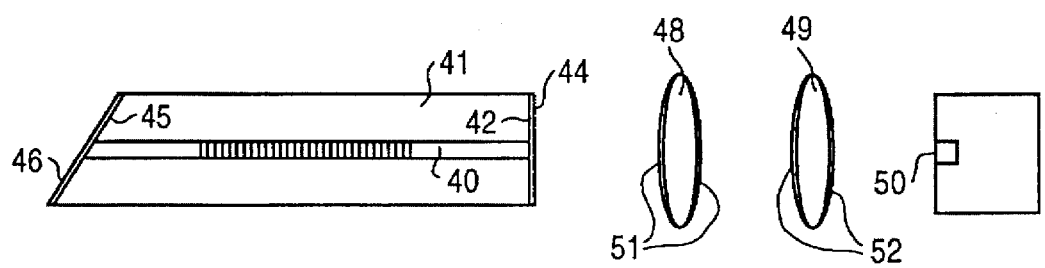

Another variation for the fiber Bragg grating is shown in FIG. 2C. The end of the fiber Bragg grating 41 facing the laser diode has a flat surface 42 which is perpendicular to the longitudinal axis of the fiber Bragg grating 41. The surface 42 is covered with an antireflection coating 44. Likewise, the opposite end of the grating 41 has an angled flat surface 45 which is covered with an antireflection coating 46. Since the grating 41 does not have an expanded diameter core as the grating shown in FIG. 2B, nor a microlens as shown in FIG. 2A, an external lens system is used to direct light from the laser diode into the core 40 of the grating 41 and from the core 40 back into the laser diode. In FIG. 2C, the lens system is represented by two lenses, 48 and 49. The lenses 48 and 49 are respectively covered by antireflection coatings 51 and 52 to facilitate the transmission of light through these lenses. The lens 49 accepts the light from the small facet area of the laser diode and directs the light in collimated rays toward the lens 48, which refocuses this light into the end of the core 40 of the fiber Bragg grating 41. Conversely, light reflected by the grating 41 is received by the lens 48, which transmits the light in collimated rays toward the lens 49, which refocuses the light at the facet of the laser diode.

Figure 3A:
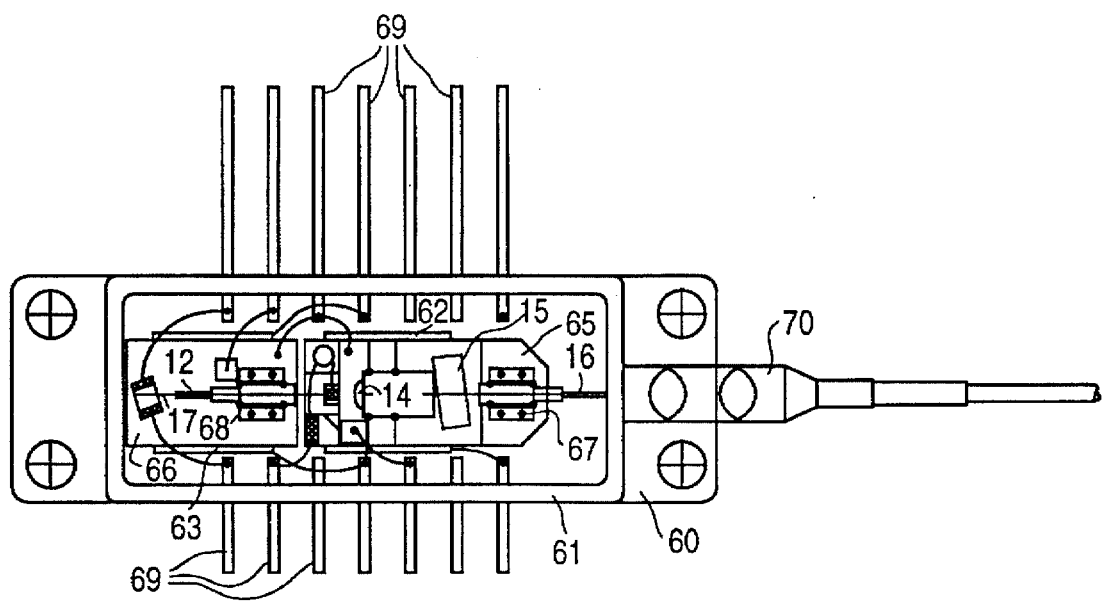
FIGS. 3A is a cross-sectional top view of a laser diode package assembly according to the present invention.
Figure 3B:
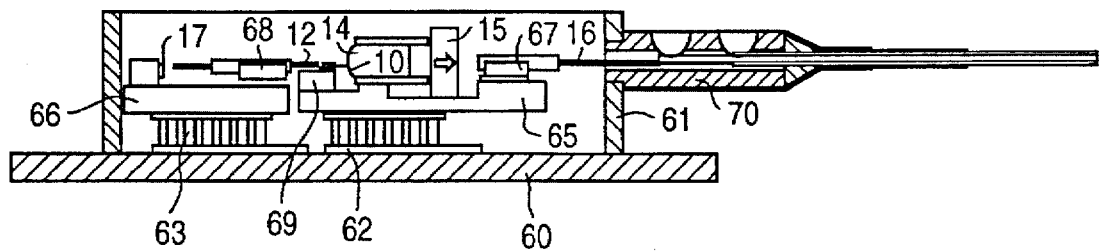
FIG. 3B is a cross-sectional side view of the FIG. 3A laser diode package assembly.

FIGS. 3A and 3B are respectively top and side cross-sectional views of the present invention in a so-called butterfly package. To further facilitate an understanding of the present invention, the same reference numerals from FIG. 1 are used, where possible, to identify the elements which have the same functions as that described with respect to FIG. 1.

The package has a base plate 60 with side walls 61. The lid of the package is not shown. A fiber holding fixture 70 mounts into one of the side walls 61 of the package and holds the output fiber 16. The laser diode 10 is fixed to the base 69 which, in turn, is fixed to a heat sink 65. The lens complex 14 is also fixed to the heat sink 65, along with the optical isolator subassembly 15. The output fiber 16 is mounted in a cylindrical holder which is fixed to a fiber clip 67 mounted to the heat sink 65. The bottom of the heat sink 65 is fixed to one surface of a thermoelectric cooler unit 62. The other surface of the thermoelectric cooler unit 62 is fixed to the base plate 60. On the opposite side of the laser diode 10, the fiber Bragg grating 12 is positioned by a grating clip 68 which is mounted to a second heat sink 66. While various designs may be used for the clips 67 and 68, a particularly suitable clip is described in U.S. application Ser. No. 08/597,449, entitled, "FIBEROPTIC SUPPORT CLIP," filed Feb. 2, 1996 by J. J. Pan, Paul Shi-Qi Jiang, Ming Shih, Jian Chen, and Li-Hua Wang, and assigned to the present assignee.

Near the opposite end of the fiber Bragg grating 12 is a photodiode 17 which receives the light which is not reflected by the grating 12. The photodiode is also mounted to the second heat sink 66 which has its base mounted to one surface of a second thermoelectric cooler unit 63. The other surface of the thermoelectric cooler unit 63 is mounted to the base plate 60. The photodiode 17 monitors the output of the laser diode 10.

Leads 69 provide the electrical connections for the various components of the assembly. For example, the laser diode 10, the thermoelectric cooler units 62 and 63, and the photodiode 17 require such connections. Additionally, the performance of laser diode package is improved by coating portions, or all, of the interior of the package with an antireflection coating, as described in U.S. application Ser. No. 08/588,357, entitled "AN IMPROVED LASER DIODE PACKAGE WITH ANTI-REFLECTION AND ANTI-SCATTERING COATING," filed Jan. 18, 1996 by J. J. Pan, Paul Shi-Qi Jiang, Jian Chen and Li-Hua Wang, and assigned to the present assignee.

Figure 4:
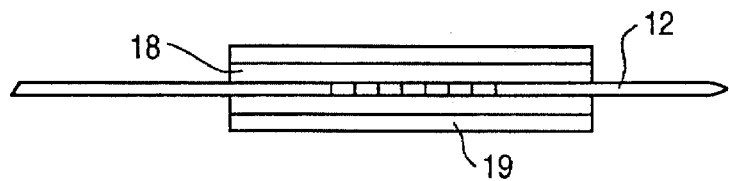
FIG. 4 is a cross-sectional side view of the fiber Bragg grating subassembly in the laser diode package assembly of FIGS. 3A and 3B.

FIG. 4 shows a cross-sectional detail of the mounting for the fiber Bragg grating 12. The fiber Bragg grating 12 is held by a cylindrical tubing 18 in which the grating 12 is fixed by epoxy. The tubing 18 is formed from material which has a thermal expansion coefficient similar to that of the fiber Bragg grating 12. Materials, such as quartz and metallic materials such as Invar and Kovar, have been found to be suitable for the tubing 18. This reduces the drift in wavelength of the fiber Bragg grating by changes in temperature.

The resonant frequency of a fiber Bragg grating is:

$$\lambda = 2n_{eff}\Lambda$$

where $n_{eff}$ is the effective refractive index of the core of the fiber Bragg grating and $\Lambda$ is the physical period of propagation constant (or refractive index) variation in the fiber Bragg grating 12. The following relationship between wavelength and temperature is determined:

$$\frac{d\lambda}{dT} = 2\frac{dn_{eff}}{dT}\Lambda + 2n_{eff}\frac{d\Lambda}{dT}$$

With reasonable assumptions on the parameters of the fiber Bragg grating, such as the assumption that thermal expansion coefficient of the core of the fiber grating is that of fused quartz, $n_{eff}=1.469$ for the core of the fiber Bragg grating formed from Corning SMF-28 fiber, and $\lambda=1550$ nm, a change of wavelength in nanometers for a change of degree Centigrade is found:

$$\Delta\lambda = 0.00968\Delta T$$

On the other hand, if the tubing 18 were formed from material having a dissimilar thermal expansion coefficient, such as stainless steel, a far greater change is determined:

$$\Delta\lambda = 0.019\Delta T$$

Thus the combination of the low thermal expansion coefficient for the core of the fiber Bragg grating and the avoidance of a material for the tubing 18 which increases the sensitivity of the fiber Bragg grating 12 to changes in temperature helps maintain the stability of the grating 12 over changes in temperature.

To further insensitize the fiber Bragg grating 12 (and the operation of the laser diode assembly) to temperature variations, the tubing 18 is inserted into, and fixed in, a tubular piezoelectric transducer 19. Alternatively, the grating 12 and tubing 18 can be attached to a rod or bar of piezoelectric transducer material. The transducer 19 maintains the physical period $\Lambda$ of propagation constant variation in the fiber Bragg grating 12 so that the wavelength linewidth reflected by the grating 12 does not change with variations in temperature. For example, if the temperature rises, the transducer 19 is induced to contract to counter any expansion in the fiber Bragg grating 12 and tubing 18. Laminated-type piezoelectric transducers, which require low operating voltages, have been found to work effectively. Such transducers may be obtained from Tokin Corporation of Sendai, Japan, and the Electro Ceramics Division of Morgan Matroc, Inc. of Bedford, Ohio. Note that the electronic feedback controls which generate the operating voltages are not described in detail since such controls are well known to electronic design engineers. Thus the output of the laser diode 10 is not only very narrow, as shown in FIG. 6 below, but also stable over time.

It should be further evident that the piezoelectric transducer can used to tune the output of the laser diode 10. For example, the piezoelectric transducer can be expanded to shift the output of the laser diode 10 to longer wavelengths or contracted to shift the output to shorter wavelengths. Of course, this "tuning" by the piezoelectric transducer is limited, but in networks with tightly packed wavelength channels, such as the proposed ITU Dense WDM network standard, such tuning can occur over many communication channels.

Figure 5:
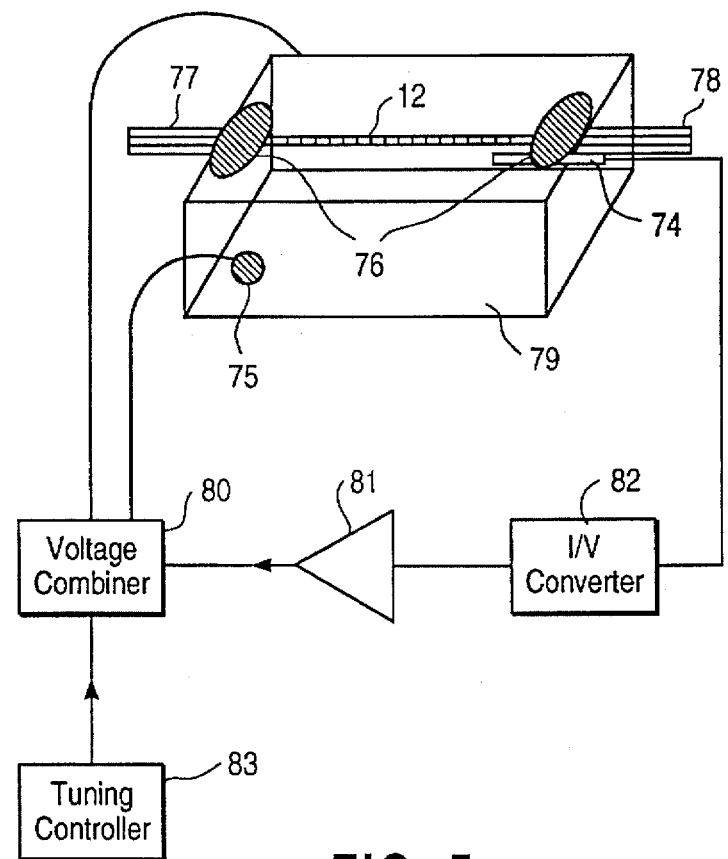
FIG. 5 is an arrangement to control the fiber Bragg grating to tune the output of the laser diode.

FIG. 5 illustrates an arrangement by which a laser diode may be tuned by a piezoelectric transducer. Two ends of the fiber Bragg grating 12 is inserted and fixed in tubing sections 77 and 78. These tubing sections 77 and 78 are fixed to a piezoelectric transducer block 79 by bonding points 76. A thermistor 74 is also attached to the block 79 near the tubing section 78 by a bonding points 76. The thermistor 74 is electrically connected to an I/V converter 82 which converts current from the thermistor 74 to a voltage signal. This signal is increased by an amplifier 81 and the amplified voltage signal is sent to one input of a voltage combiner block 80. A second input of the voltage combiner block 80 is connected to an output of a tuning controller block 83. The voltage combiner block 80 is connected to the transducer block 79 by wire bonding points 75, only one of which is shown in FIG. 5. This arrangement allows the fiber Bragg grating 12 to tune the output of a connected laser diode in response to the tuning controller block 83, while the output of the diode remains invariant under temperature variations in response to the current signals from the thermistor 74, as explained above.

Figure 6:
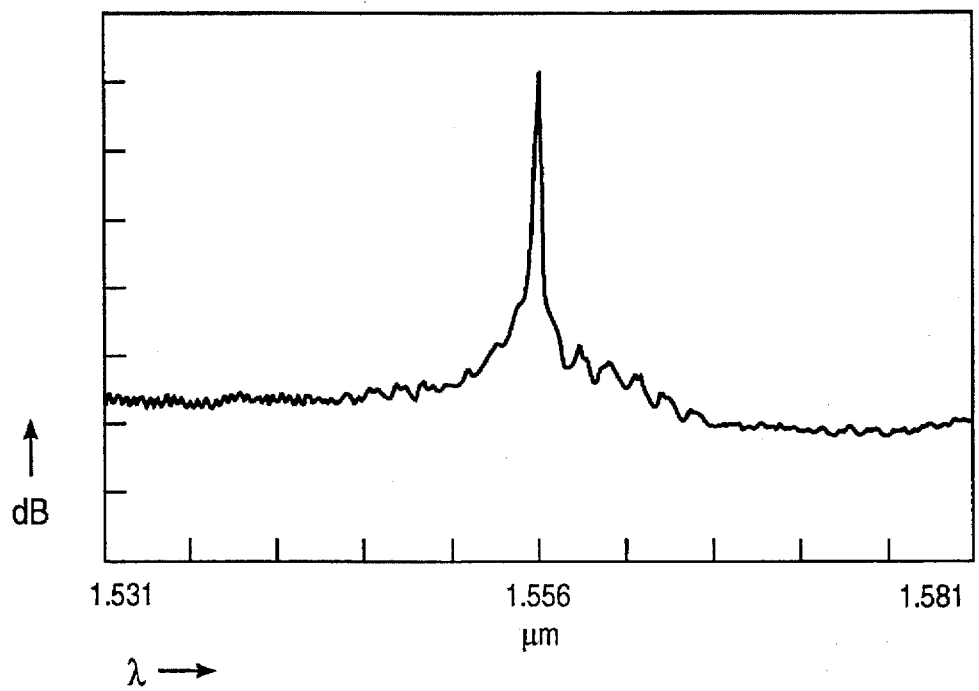
FIG. 6 is a graph of output signal strength versus wavelength for a laser diode package assembly according to the present invention.

FIG. 6 illustrates the narrow linewidth output of a laser diode assembly, such as illustrated in FIGS. 3A and 3B, in accordance with the present invention. The FIG. 6 graph plots the intensity (dB) over wavelength of the output of a laser diode assembly, as previously described. The output is centered about 1556 nm with an extremely narrow linewidth.

While the description above provides a full and complete disclosure of the preferred embodiments of the present invention, various modifications, alternate constructions, and equivalents will be obvious to those with skill in the art. Thus, the scope of the present invention is limited solely by the appended claims.

What is claimed is:

1. A semiconductor laser source comprising
   a laser diode having first and second facets from which output light is emitted; and
   a fiber Bragg grating having a first end proximate said second facet for receiving output light therefrom, said fiber Bragg grating having a selected narrow linewidth to reflect output light in said selected narrow linewidth back into said second facet so that output light emitted from said first facet has a very narrow linewidth.

2. The semiconductor laser source of claim 1 wherein said fiber Bragg grating has a longitudinal axis and a second end, said second end comprising a flat surface at an angle with respect to a plane perpendicular to said longitudinal axis, said flat surface coated with anti-reflection material.

3. The semiconductor laser source of claim 2 wherein said angle is in the range of 8°–11°.

4. The semiconductor laser source of claim 1 wherein said first end comprises a microlens at an end of an optical fiber.

5. The semiconductor laser source of claim 4 wherein said microlens is covered with a coating of anti-reflection material.

6. The semiconductor laser source of claim 1 wherein said first end comprises an end of an optical fiber having an enlarged core.

7. The semiconductor laser source of claim 4 wherein said end of an optical fiber is covered with a coating of anti-reflection material.

8. The semiconductor laser source of claim 1 wherein said first end comprises an end of an optical fiber having a core, and further comprising a lens focussing light output from said second facet into said core.

9. The semiconductor laser source of claim 8 wherein said end of an optical fiber and said lens are covered with a coating of anti-reflection material.

10. The semiconductor laser source of claim 1 further comprising
    an end of an output optical fiber;
    a lens intermediate said first facet and said end of said output optical fiber, said lens focussing light output emitted from said first facet into said end of said output optical fiber;
    an optical isolator subassembly intermediate said first facet and said end of said output optical fiber, said optical isolator subassembly passing light from said first facet toward said end of said output optical fiber and blocking light from said end of said optical fiber toward said first facet.

11. A semiconductor laser source comprising
    a package housing;
    a first thermoelectric unit and a second thermoelectric unit mounted to said package housing;
    a laser diode having first and second facets from which output light is emitted, said laser diode mounted to said first thermoelectric unit to maintain said laser diode at a predetermined temperature;
    a fiber Bragg grating having a first end proximate said second facet for receiving output light therefrom, said fiber Bragg grating having a selected narrow linewidth to reflect output light in said selected narrow linewidth back into said laser diode so that output light emitted from said first facet has a very narrow linewidth; and
    a piezoelectric transducer mounted to said second thermoelectric unit to maintain said piezoelectric transducer at said predetermined temperature, said piezoelectric transducer holding said fiber Bragg grating so that said fiber Bragg grating is protected from thermal expansion and contraction.

12. The semiconductor laser source of claim 11 wherein said fiber Bragg grating has a second end, and said semiconductor laser source further comprises a photodiode mounted to said package proximate said second end, said photodiode monitoring light output from said second facet of said laser diode.

13. The semiconductor laser source of claim 12 wherein said fiber Bragg grating has a longitudinal axis and said second end comprises a flat surface at an angle with respect to a plane perpendicular to said longitudinal axis, said flat surface coated with anti-reflection material.

14. The semiconductor laser source of claim 11 further comprising a tubing enclosing said fiber Bragg grating, said tubing fixed to said piezoelectric transducer.

15. The semiconductor laser source of claim 14 wherein said tubing comprising a material having a thermal coefficient approximately the same as that of said fiber Bragg grating.

16. The semiconductor laser source of claim 15 wherein said material is selected from the group consisting of quartz, Kovar, and Invar.

17. A subassembly for tuning a fiber Bragg grating comprising a piezoelectric transducer responsive to electrical signals;

a fiber Bragg grating;

a tubing mounted to said piezoelectric transducer and enclosing said fiber Bragg grating, said tubing comprising a material having a thermal coefficient approximately that of said fiber Bragg grating, said piezoelectric transducer expanding and contracting said tubing to tune said fiber Bragg grating.

18. The fiber Bragg grating tuning subassembly of claim 17 further comprising a thermoelectric unit fixed to said piezoelectric transducer for reducing fiber Bragg grating sensitivity to temperature variations.

19. The fiber Bragg grating tuning subassembly of claim 17 wherein said fiber Bragg grating has a longitudinal axis and said second end comprises a flat surface at an angle with respect to a plane perpendicular to said longitudinal axis, said flat surface coated with anti-reflection material.

20. The fiber Bragg grating tuning subassembly of claim 19 wherein said angle is in the range of 8°–11°.

21. The fiber Bragg grating tuning subassembly of claim 20 wherein said material is selected from the group consisting of quartz, Kovar, and Invar.

* * * * *